(12) United States Patent
Maldei et al.

(10) Patent No.: US 6,822,301 B2
(45) Date of Patent: Nov. 23, 2004

(54) MASKLESS MIDDLE-OF-LINE LINER DEPOSITION

(75) Inventors: Michael Maldei, Durham, NC (US); Jinhwan Lee, Cary, NC (US); Guenter Gerstmeier, Chapel Hill, NC (US); Brian Cousineau, Burlington, NC (US); Jon S. Berry, II, Raleigh, NC (US); Steven M. Baker, Apex, NC (US); Malati Hedge, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/210,132

(22) Filed: Jul. 31, 2002

(65) Prior Publication Data

US 2004/0021154 A1 Feb. 5, 2004

(51) Int. Cl.[7] .............................................. H01L 29/76
(52) U.S. Cl. ........................ 257/395; 257/325; 257/334; 257/510; 257/513
(58) Field of Search ................................. 257/325, 395, 257/333, 334, 389, 510, 513

(56) References Cited

U.S. PATENT DOCUMENTS

| | | | | |
|---|---|---|---|---|
| 5,668,035 A | * | 9/1997 | Fang et al. ................. | 438/239 |
| 5,863,820 A | * | 1/1999 | Huang ........................ | 438/241 |
| 6,287,913 B1 | * | 9/2001 | Agnello et al. ............. | 438/241 |
| 6,333,222 B1 | * | 12/2001 | Kitazawa et al. ........... | 438/241 |
| 6,339,237 B1 | * | 1/2002 | Nomachi et al. ........... | 257/282 |
| 6,362,094 B1 | * | 3/2002 | Dabbaugh et al. .......... | 438/637 |
| 6,380,576 B1 | * | 4/2002 | Tran ........................... | 257/296 |
| 6,406,976 B1 | * | 6/2002 | Singh et al. ................ | 438/423 |
| 6,436,759 B1 | * | 8/2002 | Chien et al. ................ | 438/241 |
| 6,482,699 B1 | * | 11/2002 | Hu et al. .................... | 438/258 |
| 6,503,789 B1 | * | 1/2003 | Kim et al. .................. | 438/232 |
| 6,518,618 B1 | * | 2/2003 | Fazio et al. ................. | 257/315 |

FOREIGN PATENT DOCUMENTS

JP       56040273 A * 4/1981 ........... H01L/27/08

* cited by examiner

*Primary Examiner*—Tom Thomas
*Assistant Examiner*—Eugene Lee
(74) *Attorney, Agent, or Firm*—Brinks Hofer Gilson & Lione

(57) ABSTRACT

A process for fabricating a semiconductor structure, wherein the semiconductor structure includes a core region and a periphery region. The core region includes a plurality of transistors and the periphery region includes a plurality of transistors. The process includes depositing a middle-of-line liner using plasma enhanced chemical vapor deposition overlying the semiconductor structure. By using a plasma enhanced chemical vapor deposition the amount of MOL liner deposited in the core region and the periphery region can be controlled depending on the distances between transistors in the core region and periphery region.

10 Claims, 4 Drawing Sheets

MASKLESS MIDDLE-OF-LINE LINER DEPOSITION

BACKGROUND

This invention relates generally to semiconductor devices. In particular, the present invention relates to a process for manufacturing a semiconductor structure for a semiconductor memory device.

Semiconductor memory devices are currently in widespread use in electronic components that require retention of information. Semiconductor memory devices include random access memory (RAM), Dynamic Random Access Memory (DRAM), read only memory (ROM), programmable read only memory (PROM), erasable programmable read only memory (EPROM), and electrically erasable programmable read only memory (EEPROM) devices. Some DRAM devices include a core region and a periphery region. The core and periphery region include a plurality of transistors. Usually, the transistors are either vertical transistors or lateral transistors. As the size of the memory devices shrink, memory devices may include vertical transistors instead of lateral transistors in the core region so that the gate length may become independent of manufacturing limitations such as the core groundrule.

The core groundrule is the smallest distance or feature size that may be manufactured for a particular product. For example, for a DRAM memory device having a 0.17 micron groundrule, the gates in the core would be 0.17 microns wide and the distance in between two gates would also be 0.17 microns. As the technology moves to smaller core groundrules, e.g. 0.15 microns, 0.13 microns, or even 0.11 microns, the gate length would also typically shrink. However, shrinking the gate length leads to a larger sub-VT (voltage threshold) leakage. Sub-VT leakage is current leakage caused when electrical current flows underneath the gate from source to drain without opening the gate. Sub-VT leakage allows the capacitors to leak charge causing low retention time.

In the current process for manufacturing DRAM memory devices which use vertical transistors in the core, a contact etch is performed in the core to connect the semiconductor substrate to a series of contacts. The contact etch is performed through a middle-of-line (MOL) liner which typically consist of silicon nitride. The contact etch passes through a silicon oxide layer and a silicon nitride layer to make contact with the semiconductor substrate, and more particularly, an active crystalline silicon region within the semiconductor substrate. The semiconductor substrate is an ion implanted crystalline silicon. Unfortunately, the contact etch often etches a portion of the gate cap silicon nitride layer in addition to etching through the MOL liner, the silicon oxide layer and the silicon nitride layer. Etching a portion of the gate cap layer increases the risk of shorting between the bit-line and the word-line.

While the MOL liner is useful in the periphery region to prevent contamination of the transistors in the periphery region, the MOL liner is not required in the core region because there is already a prior layer of silicon nitride underneath the silicon oxide layer. Typically, a mask is used to remove the MOL liner from the core region and not the periphery region.

BRIEF SUMMARY

According to a first aspect of the present invention, a process for fabricating a semiconductor structure is provided. The semiconductor structure comprises a core region and a periphery region. The core region comprises a plurality of vertical transistors and the periphery region comprising at least one lateral transistor. The process includes depositing a middle-of-line liner using plasma enhanced chemical vapor deposition overlying the semiconductor structure. By using a plasma enhanced chemical vapor deposition, the amount of MOL liner deposited in the core region and the periphery region can be controlled depending on the distances between transistors in the core region and periphery region. In one embodiment, the space between the transistors in the core region is less than the space between transistors in the periphery region, thus allowing more MOL liner to be deposited in the periphery region than in the core region. By having less MOL liner deposited in the core region than in the periphery region, the need for a mask to remove the MOL liner from the core region and not the periphery region is reduced or even eliminated.

In a second aspect of the present invention, a semiconductor structure is provided. The structure includes a semiconductor substrate having a core region and a periphery region. The structure also includes a plurality of transistors in the core region spaced a first distance apart, and plurality of transistors in the periphery region space a second distance apart, wherein the second distance is greater than the first distance. The structure also includes an oxide layer located in the core region overlying a nitride layer, and a middle-of-line liner overlying the semiconductor structure. The thickness of the nitride layer between the transistors in the core region is less than the thickness of the nitride layer between transistors in the periphery region.

Figure 1:
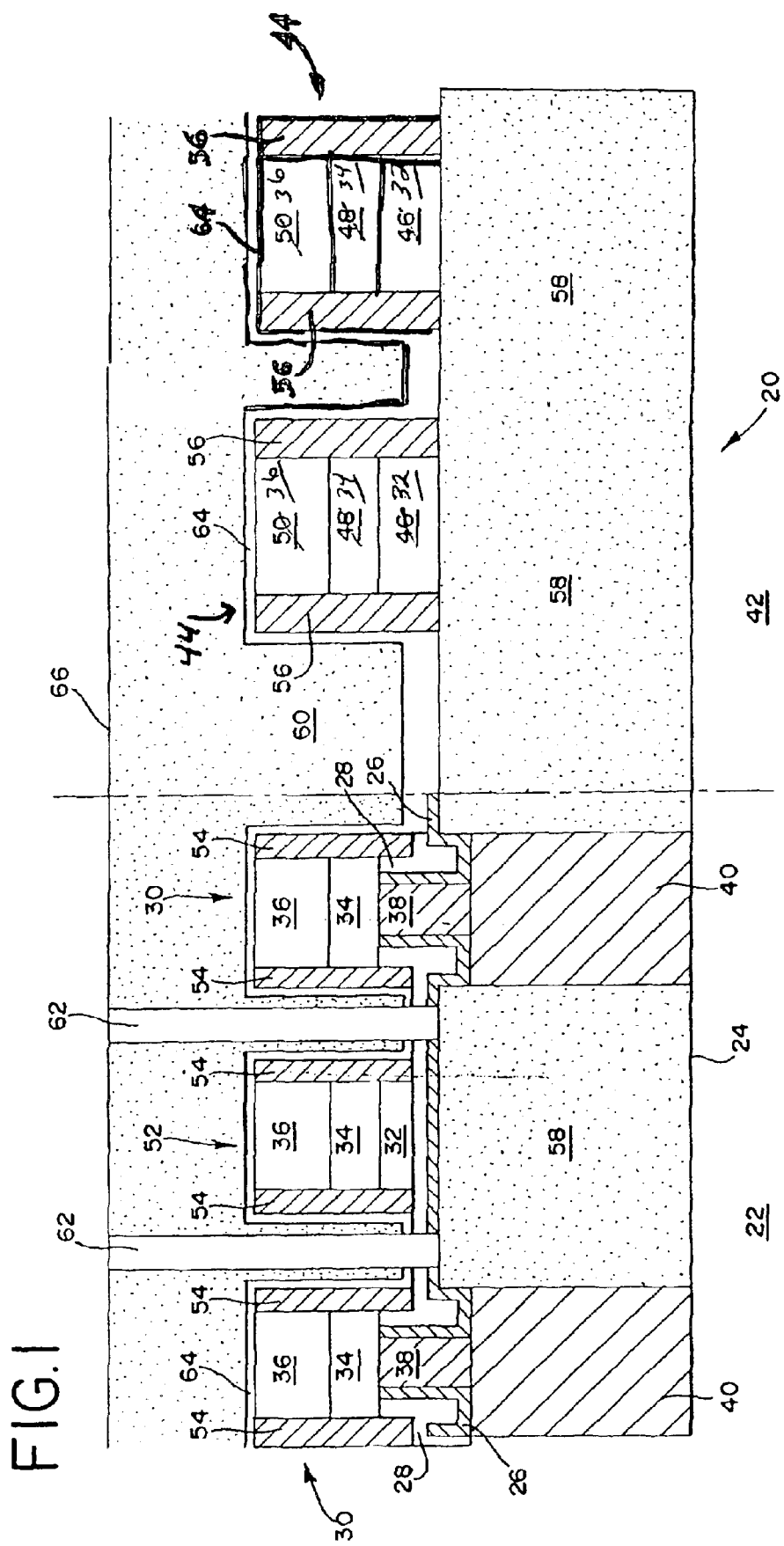
FIG. 1 illustrates, in cross-section, a portion of a semiconductor structure, in accordance with one embodiment of the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

FIG. 1 shows a semiconductor structure 20 in cross-section which includes a core region 22 and a periphery region 42. The core region 22 includes a passing wordline 52 in between a plurality of vertical transistors 30 and overlying a semiconductor substrate 24. The periphery region 42 includes at least one lateral transistor 44 overlying the semiconductor substrate 24. A middle-of-line (MOL) liner 64 overlies the passing wordline 52, the vertical transistors 30, and the lateral transistor 44. In order to fill-in the gaps between features such as transistors 30, 44 and passing wordline 52, an insulative layer 60 is placed in between and above the transistors 30, 44 and passing wordline 52 as illustrated in FIG. 1. Additionally, a contact 62 passes through the insulative layer 60 to the semiconductor substrate 24.

Figure 2:
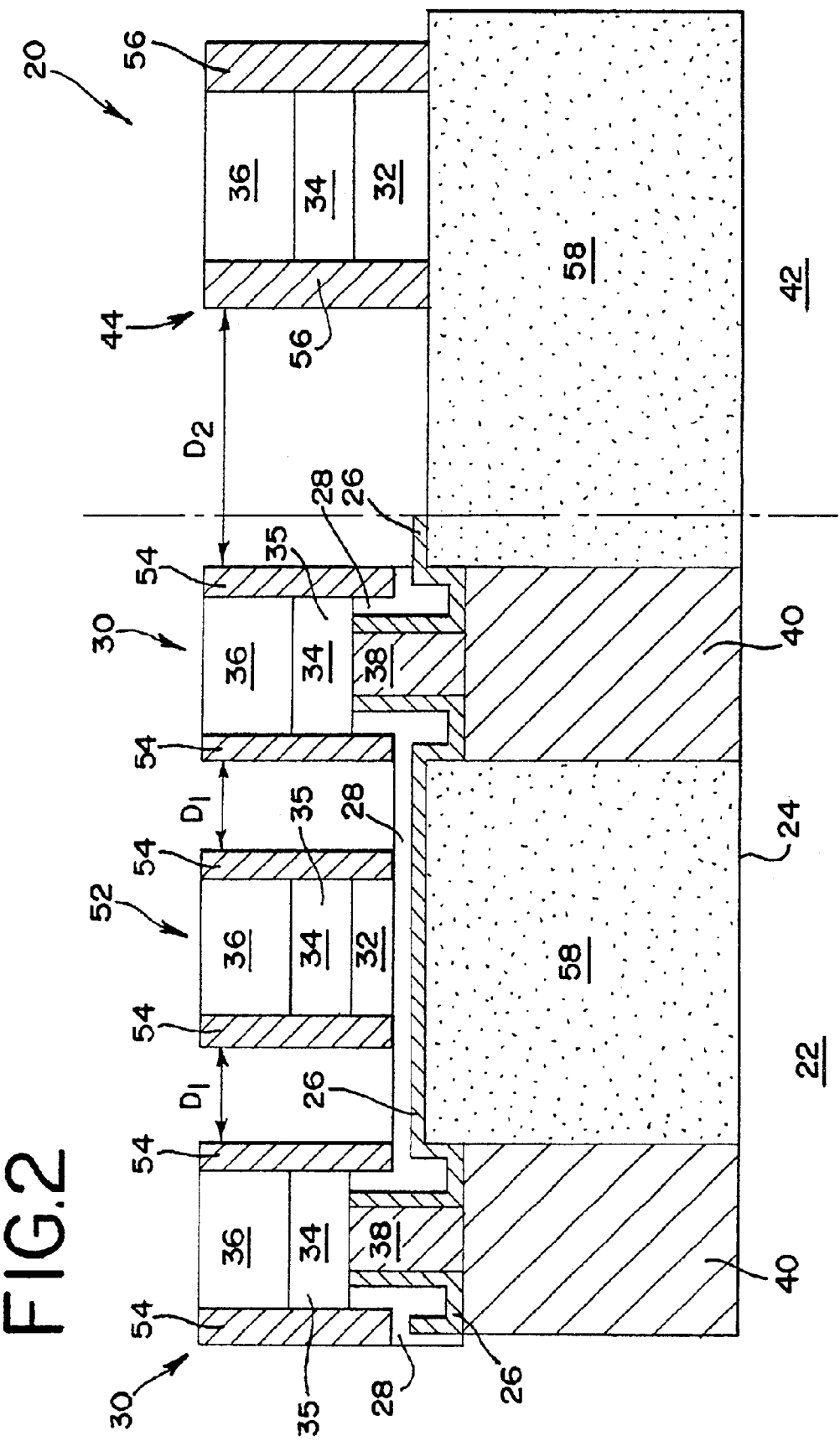
FIGS. 2–4 illustrate, in cross-section, a semiconductor structure at various stages of fabrication of the semiconductor structure illustrated in FIG. 1.

Referring to FIG. 2, the semiconductor structure 20 of the present invention is fabricated using a semiconductor substrate 24. The semiconductor substrate 24 comprises a single crystal silicon substrate, however, the semiconductor substrate 24 may comprise other materials. In one embodiment, the semiconductor substrate 24 has a principal surface previously processed and cleaned to remove debris and native oxides.

The core region 22 includes a passing wordline 52 in between a plurality of vertical transistors 30 spaced a distance D1 apart and overlying the semiconductor substrate 24. The semiconductor substrate 24 includes a crystalline silicon region 58 adjacent and in between a plurality of polycrystalline silicon regions 40, as illustrated in FIG. 2. The vertical transistors 30 overlie the polycrystalline silicon region 40 while the passing wordline 52 overlies the crystalline silicon region 58, as illustrated in FIG. 2. Each vertical transistor 30 includes a nitride layer 26, an oxide layer 28, a gate conductor 35, a gate cap layer 36, and a pair of gate spacers 54. The gate conductor 35 overlies the polycrystalline silicon region 40.

The vertical transistors 30, the passing wordline 52 and the lateral transistor 44 in the periphery comprise wordlines or gates that supply electrical current to operate the transistor 30, 44 or passing wordline 52. The wordlines or gates generally have a gate conductor 35 that supply the current and a gate cap layer 36 overlying the gate conductor 35. The gate conductor 35 can consists of many materials having multiple layers. In one embodiment, the gate conductor 35 includes a first conductive layer 34 and a second conductive layer 38 underneath the first conductive layer 34, as illustrated in FIG. 2. Preferably, the first conductive layer 34 comprises tungsten silicide while the second conductive layer 38 comprises polycrystalline silicon. In one embodiment, the second conductive layer 38 and the polysilicon layers 32 all comprise the same material, polycrystalline silicon.

The second conductive layer 38 comprises conductive material such as, but not limited to, polycrystalline silicon and amorphous silicon. The nitride layer 26 overlies the polycrystalline silicon region 40 and is adjacent to two opposing sides of the second conductive layer 38, as illustrated in FIG. 2. The oxide layer 28 overlies the nitride layer 26. The gate cap layer 36 overlies the gate conductor 34, which both overlie the second conductive layer 38. The gate cap layer 36 is manufactured from an insulative material such as silicon nitride, silicon oxide, or silicon oxynitride. The spacers 54 lie adjacent each end of the gate cap layer 36 and the gate conductor 34, as illustrated in FIG. 2. The spacers are manufactured using a insulative material such as silicon nitride, silicon oxide, silicon oxynitride, or borophosphosilicate glass (BPSG).

The passing wordline 52 is a transitional region between two vertical transistors. The passing wordline 52 includes a gate cap layer 36 overlying a gate conductor 34, which both overlie a polysilicon layer 32, as illustrated in FIG. 2. The passing transistor also includes spacers 54 adjacent each end of the gate cap layer 36, the gate conductor 34, and the polysilicon layer 32, as illustrated in FIG. 2. The passing wordline 52 overlies the oxide layer 28 and the nitride layer 26.

The periphery region 42 includes at least one lateral transistor 44 overlying the semiconductor substrate 24. More particularly, the lateral transistor 44 is situated directly above a crystalline silicon region 58 of the semiconductor substrate 24, as illustrated in FIG. 2. The lateral transistor 44 includes a gate cap layer 36 overlying a first conductive layer 34, which both overlie a second conductive layer 32, as illustrated in FIG. 2. The lateral transistor 44 also includes spacers 56 which are adjacent each end of the gate cap layer 36, the first conductive layer 34, and the second conductive layer 32, as illustrated in FIG. 2.

The distance between the passing wordline 52 and any one of the vertical transistors 30 is labeled D1, as illustrated in FIG. 2. The distance between the transistor 44 in the periphery region and any other adjacent feature, such as the vertical transistor 30 or another transistor 44 in the periphery region, is labeled D2. Preferably, the distance D1 is less than the distance D2. In one embodiment, for example, the distance D1 is less than or equal to 0.25 microns, while the distance D2 is from about 0.5 microns to about 1.0 microns.

Figure 3:
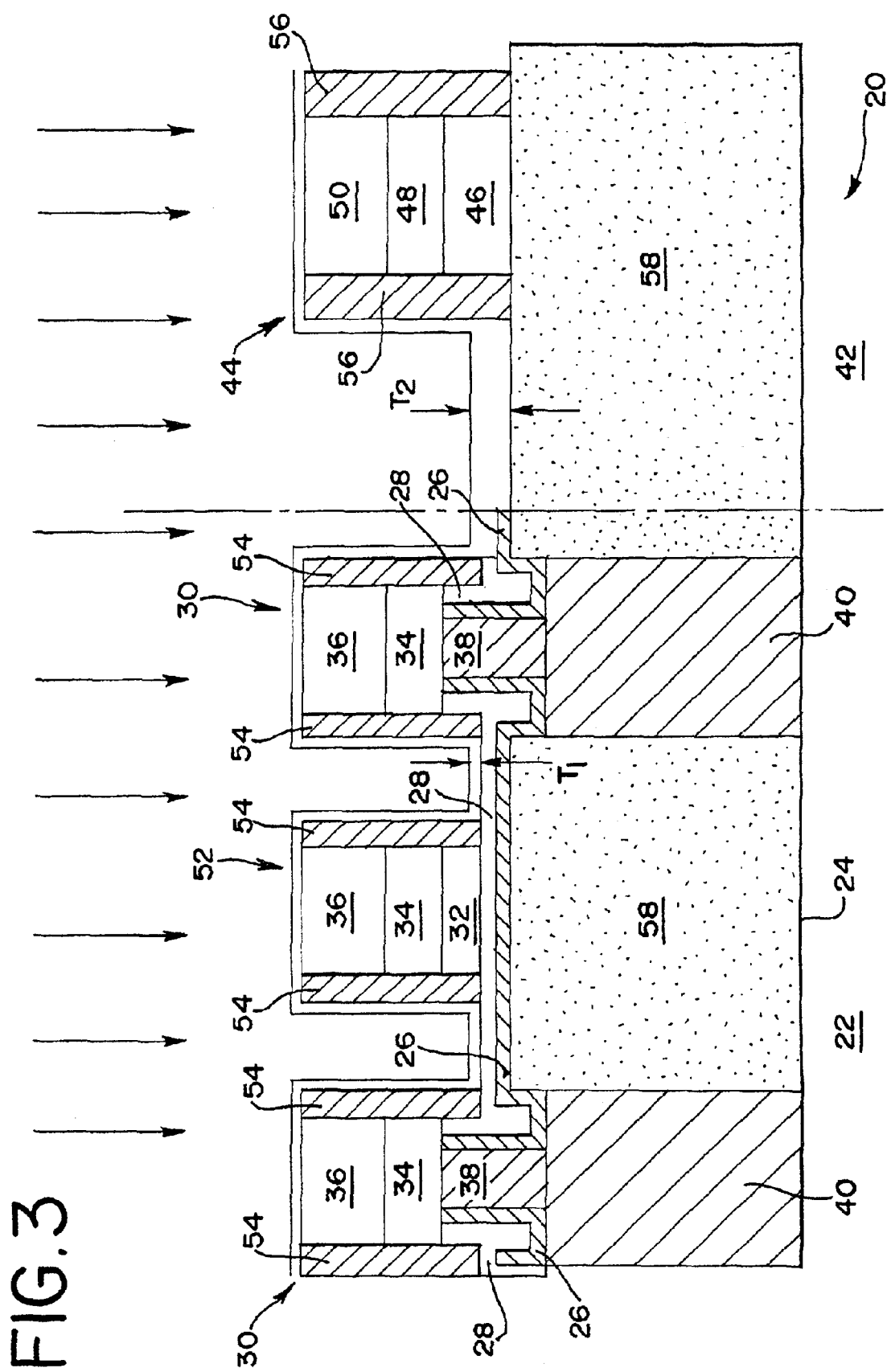
Figure 4:
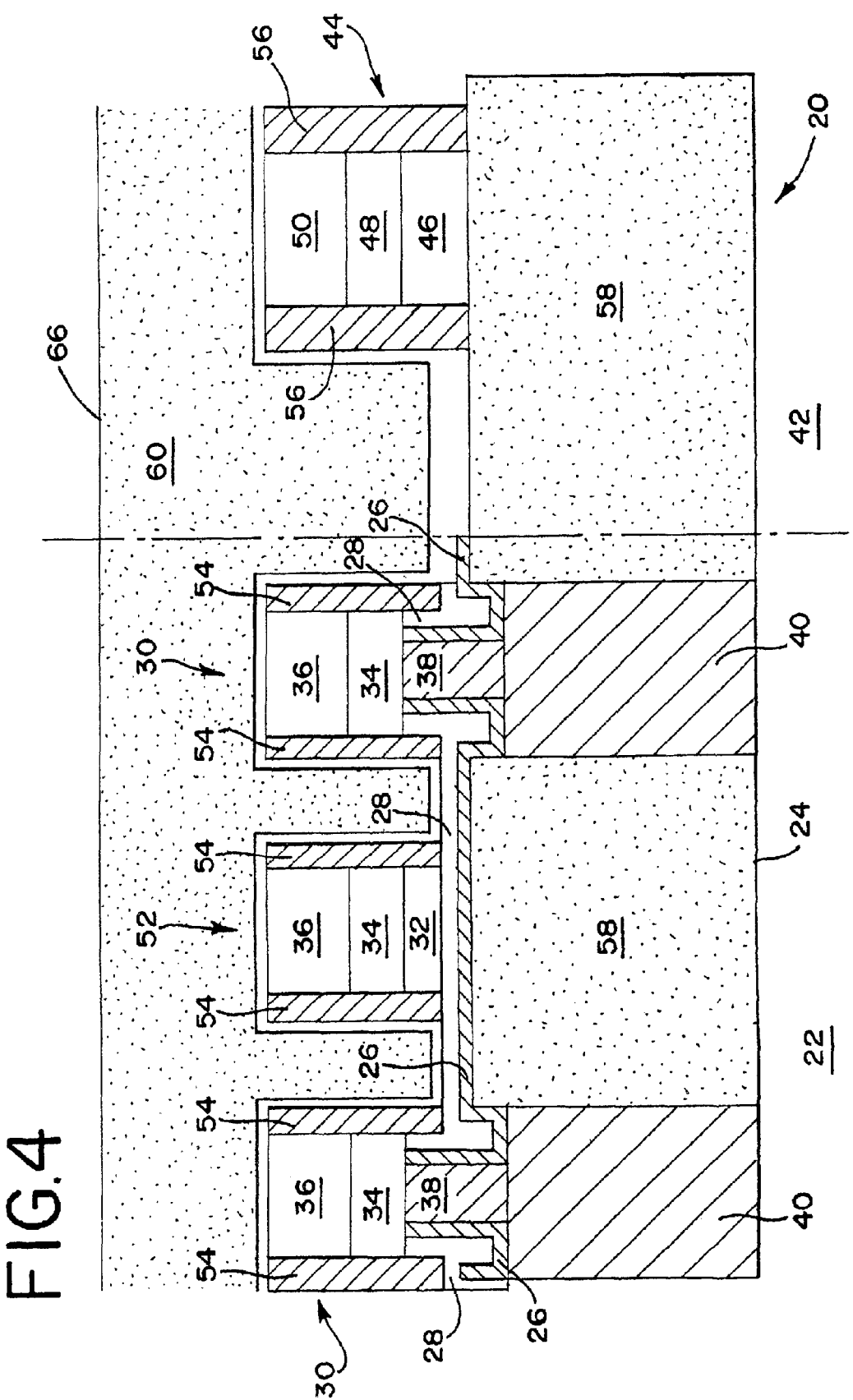

Upon forming the above described semiconductor structure 20 illustrated in FIG. 2, a middle-of-line (MOL) liner 64 is deposited overlying the semiconductor structure 20, and more particularly, overlying the above-described transistors 30, 44 and passing wordline 52, as illustrated in FIG. 3. In order to reduce the amount of MOL liner 64 deposited in-between transistor 30 and passing wordline 52 in the core region 22, the MOL liner 64 is deposited using a plasma enhanced chemical vapor deposition (PECVD). It has been determined that the amount of MOL liner 64 deposited in between the transistors 30, 44 and passing wordline 52 using PECVD is dependent on the spacing (D1 and D2) between the transistors 30, 44 and passing wordline 52. The wider the spacing of the transistors 30, 44 and passing wordline 52, the more MOL liner 64 is found at the bottom of depressions in between the transistors 30, 44 and passing wordline 52. The variation in the amount of MOL liner 64 found in between transistors 30, 44 and passing wordline 52 is due to the proximity effect. In one embodiment, the thickness T1 of the MOL liner 64 in between the transistors 30 and passing wordline 52 in the core region 22 is about half of the thickness T2 of the MOL liner 64 in between the transistors 44 in the periphery region 42. This proximity effect of PECVD deposited MOL liner 64 can be utilized to protect the crystalline silicon region 58 in the periphery region 42 from contamination while at the same time providing minimal resistance for the contact etch in the core region. Thus, the contact etch chemistry is not changed for this very thin MOL liner 64 in the core region 22 and therefore, the risk of bit-line or word-line shorts is significantly reduced. Additionally, no block mask is used when depositing the MOL liner 64, so the above-described process allows for significant cost savings when compared to conventional processes which require a block mask.

By taking advantage of the proximity effect that affects plasma enhanced chemical vapor deposition materials during deposition, less of the MOL liner 64 is deposited in-between the transistors 30 and passing wordline 52 in the core region 22 than in-between the transistors 44 in the periphery region 42, since the space D1 between the transistors 30 and passing wordline 52 in the core region 22 is less than the space D2, as illustrated in FIGS. 2–3. More particularly, the thickness T2 of the MOL liner 64 in the periphery region 42 is less than the thickness T1 of the MOL liner 64 in the core region 22, as a result of the proximity effect described above.

Upon depositing the MOL liner 64, an insulative layer 60 is deposited in-between and above the transistors 30, 44 and passing wordline 52, as illustrated in FIG. 1. Preferably, the insulative layer 60 comprises an insulative material, such as silicon nitride, silicon oxide, silicon oxynitride, or borophosphosilicate glass (BPSG). The insulative layer 60 may consist of more than one layer of insulative material. Additionally, the insulative layer 60 may consist of more than one insulative material.

Upon depositing the insulative layer 60, a contact etch is performed through the MOL liner 64 in the core region 22. The contact etch is performed through the oxide layer 28 and the nitride layer 26 as well. Preferably, the contact etch is also performed through the insulative layer 60 to the semiconductor substrate 24. The contact etch allows the contact 62, which overlies the surface 66 of the semiconductor structure 20, to be electrically connected with the semiconductor substrate 24.

The individual semiconductor processing steps used in accordance with the present invention (e.g., PECVD, etc.) are well known to those of ordinary skill in the art, and are also described in numerous publications and treatises, including: *Encyclopedia of Chemical Technology, Volume 14* (Kirk-Othmer, 1995, pp. 677–709); *Semiconductor Device Fundamentals* by Robert F. Pierret (Addison-Wesley, 1996); *Silicon Processing for the VLSI Era* by Wolf (Lattice Press, 1986, 1990, 1995, vols 1–3, respectively); and *Microchip Fabrication: A Practical Guide to Semiconductor Processing* by Peter Van Zant (4$^{th}$ Edition, McGraw-Hill, 2000).

Numerous additional variations in the presently preferred embodiments illustrated herein may be used and remain within the scope of the appended claims and their equivalents. For example, while the examples provided above relate to silicon-based semiconductor substrates, it is contemplated that alternative semiconductor materials can likewise be employed in accordance with the present invention, and that the semiconductor substrates may be undoped, P-doped, or N-doped. Suitable semiconductor materials include but are not limited to silicon, gallium arsenide, germanium, gallium nitride, aluminum phosphide, $Si_{1-x}Ge_x$ and $Al_xGa_{1-x}As$ alloys, wherein x is greater than or equal to zero and less than or equal to one, the like, and combinations thereof. Additional examples of semiconductor materials for use in accordance with the present invention are set forth in *Semiconductor Device Fundamentals* by Robert F. Pierret (p. 4, Table 1.1, Addison-Wesley, 1996).

Furthermore, a semiconductor structure produced in accordance with and embodying features of the present invention can undergo additional processing in order to produce semiconductor devices and electronic devices incorporating such semiconductor devices. For example, additional source/drain regions, gates, gate dielectric layers, and the like can be formed on the semiconductor substrate to make transistors, which may be connected together through dielectric layers by contacts and metallization layers. Such additional elements may be formed before, during, or after formation of the previously described structures.

Semiconductor structures embodying features of and produced in accordance with the present invention may be incorporated into a great variety of semiconductor devices, including but not limited to: integrated circuits (e.g., memory cells such as SRAM, DRAM, EPROM, EEPROM, and the like); programmable logic devices; data communications devices; clock generation devices; and so forth. Furthermore, any of these semiconductor devices may itself be incorporated into a multitude of electronic devices, including but not limited to computers, automobiles, airplanes, satellites, and the like.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

What is claimed is:

1. A semiconductor structure comprising:

a semiconductor substrate having a core region, the core region including a passing wordline and a plurality of transistors, and a periphery region, the periphery region including one or more transistors;

wherein the passing wordline is placed between two transistors of the plurality of transistors in the core region, a transistor having a transistor gate conductor and a transistor gate cap layer on the transistor gate conductor, the passing wordline having a wordline gate conductor and a wordline gate cap layer on the wordline gate conductor, wherein the passing wordline and an adjacent transistor of the core region are spaced a first distance apart;

wherein adjacent transistors in the periphery region are spaced a second distance apart, or wherein one transistor in the periphery region and an adjacent transistor in the core region are spaced a second distance apart, wherein the second distance is greater than the first distance;

an oxide layer located in the core region, the oxide layer lying over a nitride layer with respect to the semiconductor substrate, wherein the oxide layer and the nitride layer are arranged between the passing wordline and the semiconductor substrate, and are arranged in a first gap between the passing wordline and the adjacent transistor of the core region, the first gap having the first distance; and a middle-of-line liner overlying the passing wordline, the adjacent transistor and the oxide layer in the gap between the passing wordline and the adjacent transistor, wherein a thickness of the middle-of-line liner in the first gap in the core region is less than a thickness of the middle-of-line liner in second gaps between the transistors in the periphery region, the second gaps having the second distance.

2. The semiconductor structure of claim 1, further comprising a layer of borophosphosilicate glass overlying the middle-of-line liner.

3. The semiconductor structure of claim 1, further comprising a contact overlying the layer of borophosphosilicate glass and electrically contacted with the semiconductor substrate layer.

4. The semiconductor structure of claim 1, herein at least one transistor in the core region comprises a gate cap layer overlying a tungsten silicide layer and a first spacer opposed to a second spacer, wherein the first and second spacers are adjacent to the gate cap layer and the tungsten silicide layer.

5. The semiconductor structure of claim 1, wherein at least one transistor in the periphery region comprises a gate cap layer overlying a tungsten silicide layer and a polysilicon layer.

6. The semiconductor structure of claim 1, comprising a polycrystalline silicon region underlying at least one transistor in the core region.

7. The semiconductor structure of claim 1, wherein the transistors in the core region are vertical transistors, and wherein the transistors in the periphery region are lateral transistors.

8. The semiconductor structure of claim 1, in which, in the periphery region, the middle-of-line liner is placed on the semiconductor substrate without the oxide layer and the nitride layer placed between the middle-of-line liner and the semiconductor substrate.

9. The semiconductor structure of claim 1, wherein the middle-of-line liner includes silicon nitride.

10. The semiconductor structure of claim 1, in which the core region comprises a memory array including the word lines and the periphery region includes a support circuitry including the one or more transistors.

\* \* \* \* \*